United States Patent [19]

Ming-Tsung et al.

[11] Patent Number: 5,703,408
[45] Date of Patent: Dec. 30, 1997

[54] BONDING PAD STRUCTURE AND METHOD THEREOF

[75] Inventors: Liu Ming-Tsung, Hsin-Chu; Bill Y. B. Hsu, Chu-Pei; Hsien-Dar Chung, Hu-Wei Town; Der-Yuan Wu, Hsin-Chu, all of Taiwan

[73] Assignee: United Microelectronics Corporation, Hsin-Chu, Taiwan

[21] Appl. No.: 419,558

[22] Filed: Apr. 10, 1995

[51] Int. Cl.$^6$ .............. H01L 23/48; H01L 23/52; H01L 29/40
[52] U.S. Cl. .............. 257/784; 257/786
[58] Field of Search .............. 257/784, 786, 257/759, 758

[56] References Cited

U.S. PATENT DOCUMENTS

| | | | |
|---|---|---|---|
| 4,600,658 | 7/1986 | Anderson et al. | 428/450 |
| 4,800,177 | 1/1989 | Nakamae | 437/193 |
| 5,057,447 | 10/1991 | Paterson | 437/43 |
| 5,309,025 | 5/1994 | Bryant et al. | 257/784 |

FOREIGN PATENT DOCUMENTS

| | | | |
|---|---|---|---|
| 2-26039 | 1/1990 | Japan | 257/784 |

*Primary Examiner*—Wael Fahmy
*Assistant Examiner*—Howard Weiss
*Attorney, Agent, or Firm*—William H. Wright; Alan S. Raynes

[57] ABSTRACT

A structure and a process for forming an improved bonding pad which allows better bonding between a bond wire and a metal bonding pad. Stripes are formed on a substrate. A conformal dielectric layer, a conformal barrier layer and a metal layer are formed over the stripes. A passivation layer with a window is formed defining a bonding pad area. The stripes promote an irregular surface in the barrier and metal layers which reduce stress between the dielectric layer, the barrier layer and the metal layer. Also, the irregular surfaces increase the barrier metal adhesion to the dielectric layer, reduce bond pad peel off, and increase bonding yields.

20 Claims, 3 Drawing Sheets

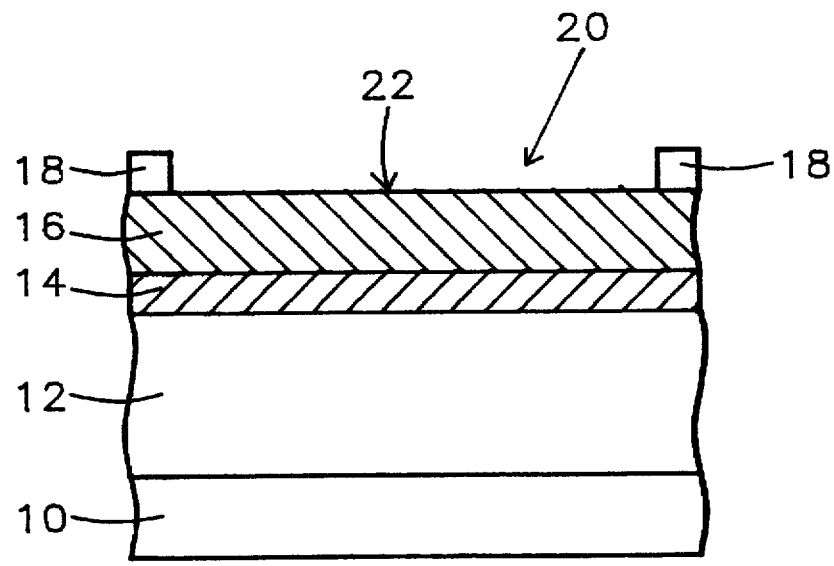
FIG. 1 - Prior Art
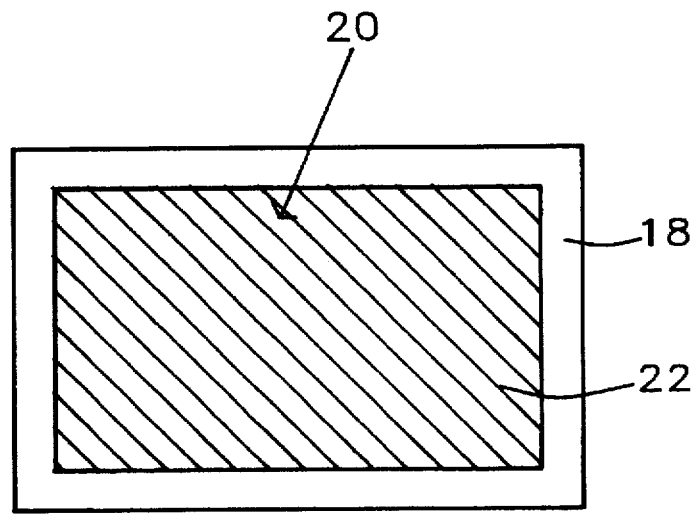
FIG. 2 - Prior Art

5,703,408

BONDING PAD STRUCTURE AND METHOD THEREOF

BACKGROUND OF INVENTION

1) Field of the Invention

The present invention relates in general to semiconductor integrated circuits, and more specifically to the formation of a bond pad structure and method for fabricating such structures.

2) Description of the Prior Art

After an integrated circuit device has completed the fabrication process, it is usually assembled into a package to be utilized on a printed circuit board as part of a larger circuit. In order for the inner leads of the package to make electrical contact with the bonding pads of the fabricated devices, a metal bond is formed at the bonding pad of the device with a lead extending to the inner lead of the package lead frame.

During the formation of a bond, bond pad lift off may occur. This problem may result when a large heavy bond (e.g., an aluminum interconnect) is placed on top of layers which have not formed a strong adhesion to the underlying layers. During formation of aluminum interconnect, it is common to form an underlying barrier layer of a material, such as titanium nitride. This barrier layer is utilized to prevent aluminum from spiking into any underlying conductive layers during later fabrication steps. However, the barrier layer, which is usually titanium nitride, does not form a strong adhesion to the oxide underlying the bond pad and may separate during the bonding process.

FIGS. 1 and 2 show a bond pad of the prior art. A dielectric layer 12 is formed on a substrate 10 surface. A barrier layer 14 is formed over the dielectric layer 12. Next, a metal bonding layer 16 is formed over the barrier layer 14. A passivation layer 18 is formed and a window 20 opened which defines a bond pad area 22.

The barrier layer 14 is used to prevent the metal layer 16 from spiking into the underlying dielectric layer 12. Unfortunately, the barrier layer 14 normally does not have a good adhesion to the underlying dielectric layer 12. This poor adhesion can lead to separation of the barrier layer 14 from the dielectric layer 12, often call "bond pad peel off". This "peel off" reduces the bonding yields and is a major problem in semiconductor manufacture, especially as devices are made smaller.

Therefore it would be desirable to provide a method for forming an improved bond pad structure whereby a bond may be formed at a bonding pad which is resistant to layer separation at the bond pad.

Anderson et al., U.S. Pat. No. 4,600,658, teaches a method of forming an adhesion layer between a resistive barrier layer and the substrate. The adhesion layer improves the bond strength between the barrier layer and the substrate.

Bryant et al., U.S. Pat. No. 5,309,025, teaches a method of forming an improved bonding pad structure. A bond pad structure is formed by patterning a barrier layer and first conductive (metal) layer thereby exposing the underlying regions of a semiconductor device. A second conductive layer is formed over the first conductive layer and the exposed underlying regions. The second conductive layer makes a good adhesive contact with the underlying regions, thus preventing bond pad pull off.

SUMMARY OF THE INVENTION

It is an object of this invention to provide a structure and process for a bonding pad layout to improve bonding yield.

It is an object of this invention to provide a structure and process for a bonding pad layout to increase the contact adhesion between the barrier layer and the underlying dielectric layer, and between the metal layer and the barrier layer and between the metal layer and the bonding wire.

It is yet another object of the invention to provide a structure and process for fabricating a bonding pad to reduce stress between the barrier layer, the metal layer and the dielectric layer, to reduce bond pad "peel off" and to increase bonding yields.

It is yet another object of the invention to provide a structure and process for fabricating a bonding pad where a dielectric layer with an irregular shaped surface is formed under a barrier layer and metal layer to reduce stress between the barrier layer, the metal layer and the dielectric layer, which reduces bond pad "peel off" and increases bonding yields.

Accordingly, the present invention provides a structure and process to form an improved bonding pad layout in a bonding pad region on a substrate. The structure of the improved bonding pad comprises spaced stripes in a least the bonding pad area. The stripes be arranged in many patterns including: parallel lines, broken parallel lines, and concentric circles. A conformal dielectric layer covers at least the stripes presenting an irregular (i.e., not smooth) top surface configuration including groves. A conformal barrier layer and conformal metal layer overlie the dielectric layer. Lastly, a passivation layer overlies the metal layer. The passivation layer has a window over the bonding pad area.

The method of the present invention begins by forming stripes in at least the bonding pad area. In the bonding pad area, a conformal dielectric layer is formed over the stripes. The conformal dielectric layer has a irregular top surface configuration having groves. Then a conformal barrier layer and a conformal metal layer are formed over the conformal dielectric layer. A conformal passivation layer is then formed over the metal layer. Lastly, a window is formed in the passivation layer over the bonding pad area.

The stripes and the resulting irregular top surface configuration in the overlying layers function to release the interface stress between the barrier layer and the dielectric layer. The irregular top surface configuration (topography) of the barrier layer inhibits microcracks (which are induced by bonding stress) improves bond yield, reduces bond pad "peel off" and increases barrier layer to dielectric adhesion strength.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 shows a cross-sectional view of a bonding pad area of a prior art structure.

FIG. 2 shows top down view of a bonding pad area of the prior art.

DETAILED DESCRIPTION OF THE PREFERRED EMBODIMENTS

Figure 3:
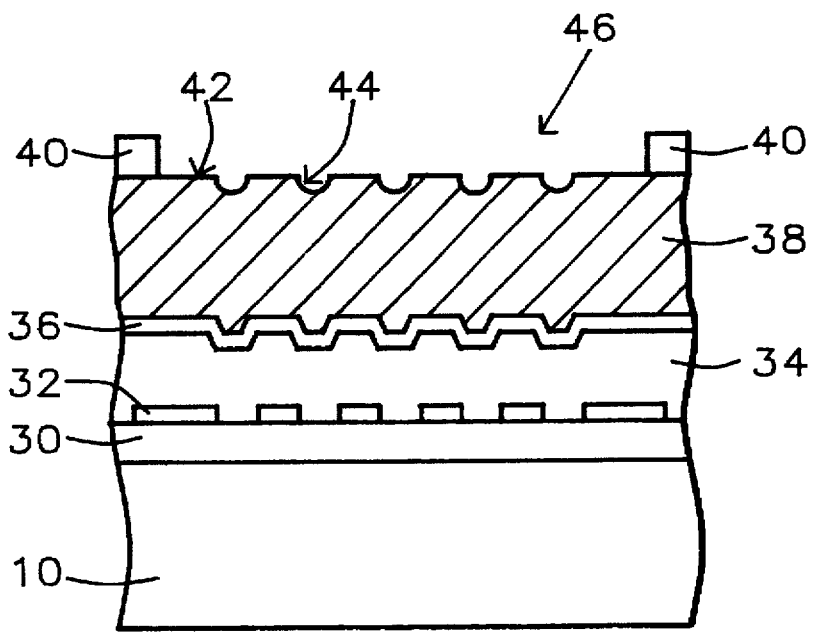
FIG. 3 shows a broken cross-sectional view of a bonding pad area of the present invention including stripes and the irregular shaped surfaces of the layer formed over the stripes.
Figure 4:
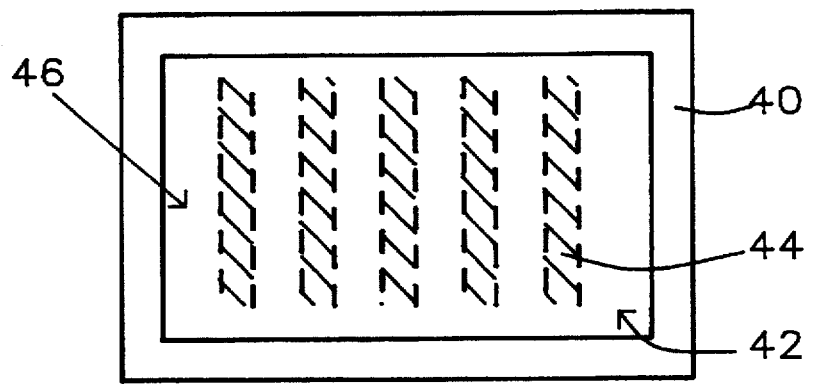
FIG. 4 shows a top down view of the bonding pad area of the present invention.

Accordingly, the current invention provides a method of forming an improved bonding pad in a bonding pad area on a substrate as shown in FIGS. 3 and 4. Substrate 10 is understood to possibly include a semiconductor wafer, devices formed within the wafer and layers formed on the wafer surface. The substrate 10 can include a top surface layer 30 of insulating material formed from a material, such as phosphosilicate glass (PSG), borophosphosilicate glass (BPSG), and silicon oxide. Also, the substrate 10 can also be a ceramic substrate. The term "substrate" is mean to include devices formed within a semiconductor wafer and the layers overlying the wafer. The term "substrate surface" is meant to include the upper most exposed layers on a semiconductor wafer.

Stripes 32 are formed in at least said bonding pad area 42. The stripes 32 are composed of a material, such as a polycide, polysilicon, titanium tungsten (TiW), a metal, and titanium nitride (TiN). The stripes have a thickness in the range of about 1000 to 8000 Å and a width in the range of about 0.5 to 20 microns. The stripes 32 form an irregular shaped top surface (non-smooth) as shown in FIG. 3. The stripes 32 can be arranged in any number of patterns as shown in FIGS. 4 through 7.

Next, a conformal dielectric layer 34 is formed over the stripes in a least the bonding pad area 42 as shown in FIG. 1. The conformal dielectric layer 34 has a irregular top surface configuration (topology) includes groves with a depth from a high point to a low point in the range of between about 1000 to 8000 Å. The depth roughly corresponds to the thickness of the underlying stripe thickness. The irregular surface configuration of the underlying stripes 32 is propagated to (i.e., maintained or transferred to) the top surface of conformal dielectric layer 34 as shown in FIG. 3. The conformal dielectric layer surface has a similar shape to the underlying irregular shaped surface. The dielectric layer 34 can be formed from a material such as phosphosilicate glass (PSG), silicon oxide, or borophosphosilicate glass (BPSG). The dielectric layer 32 has a thickness in the range of about 2000 to 10,000 Å and more preferable a thickness of about 5000 Å. It is critical that dielectric layer 34 is conformal, rather than a non-conformal layer that results in filling of the spaces between the stripes 32 and a smooth top surface.

A conformal barrier layer 36 is then formed over the conformal dielectric layer 34. The barrier layer 36 can be formed of a material, such as titanium nitride, titanium tungsten (TiW), titanium, or tungsten. The barrier layer 36 has a thickness in the range of about 500 to 2000 Å and more preferably a thickness of 1000 Å. The resulting surface after this deposition still has the irregular configuration of the underlying layers (e.g., stripes 32) and pattern.

A conformal metal layer is 38 subsequently formed over the barrier layer. The metal layer 38 is formed from a material such as copper or aluminum. The metal layer 38 can have a thickness in the range of between about 2000 to 12,000 Å and more preferably a thickness of about 10,000 Å. Here again, the resulting surface after this deposition still has the (irregular) top surface configuration and pattern of the underlying layers (i.e., stripes 32).

A passivation layer 40 is formed over said metal layer 38. The passivation layer 40 can have a thickness in the range of about 3000 to 20,000 Å and more preferably a thickness of about 10,000 Å. The passivation layer can be is formed of silicon oxide, oxynitride, silicon nitride, and borophosphosilicate glass.

A window 46 is formed in the passivation layer 40 over the bonding pad area 42. A conventional photolithography coat, expose, develop, etch process can be used to form the window 46. The window 46 can have a width in the range of about 50 to 200 μm and a height in the range of about 0.3 to 2.0 μm.

Figure 5:
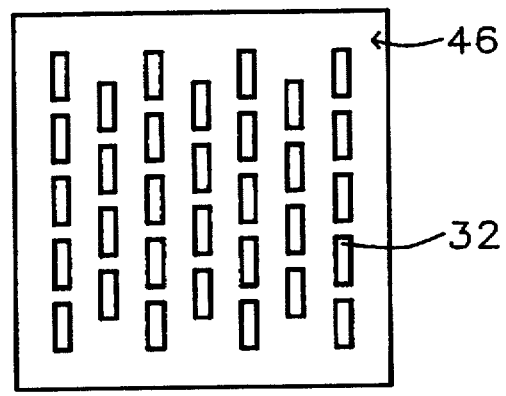
FIGS. 5 through 7 show top down views of stripe patterns for the bonding pad area of the present invention.
Figure 6:
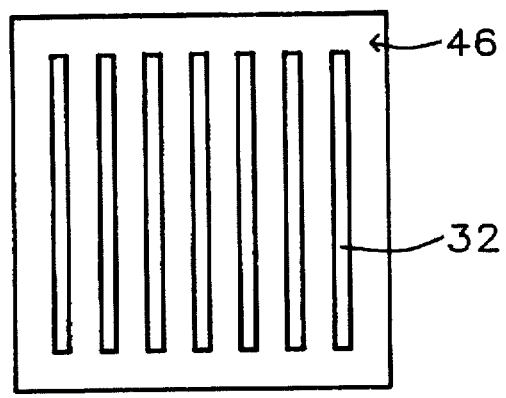
Figure 7:
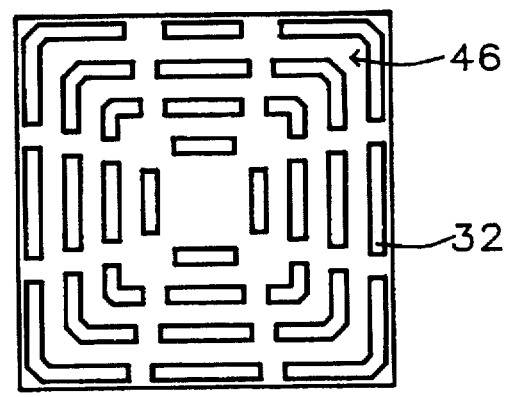

As shown in FIGS. 4 through 7, the stripes can be arranged in many patterns. FIG. 4 is a top down view showing the bonding area 42, passivation layer 40 and pattern/grove 44 in the metal layer 38 caused by the underlying stripes 32. As shown in FIG. 4, the stripes 32 can be arranged as parallel spaced lines. As shown in FIG. 5, the stripes can be formed as broken parallel spaced lines. FIG. 6 shows the stripes arranged as spaced parallel lines. As shown in FIG. 7, the stripes can be spaced concentric broken circles. Any stripe pattern can be used in the invention. The important feature of the stripes is that the barrier layer and metal layer topographies (top surface configurations) are significantly irregular (e.g., not smooth).

The stripes 32 and the resulting irregular top surface configuration in the overlying layers function to release the interface stress between the barrier layer 36 and the underlying dielectric layer 34. The irregular top surface configuration (topography) of the barrier layer 36 in the bonding pad area 42 inhibit the microcracks which are induced by bonding stress, improve bond yield, reduce bond pad "peel off" and increase barrier layer to dielectric adhesion strength. This increase; device yields.

While the invention has been particularly shown and described with reference to the preferred embodiments thereof, it will be understood by those skilled in the art that various changes in form and details may be made without departing from the spirit and scope of the invention.

What is claimed is:

1. An improved bonding pad on a bonding pad area on a substrate comprising:

spaced stripes on the substrate in a least the bonding pad area, the stripes arranged in a pattern of broken parallel spaced lines:

a conformal dielectric layer over at least the stripes presenting an irregular top surface configuration including grooves, said grooves having a depth;

a conformal barrier layer over the dielectric layer, said conformal barrier layer having an irregular top surface configuration including grooves;

a conformal metal layer over said barrier layer; and a passivation layer over said metal layer having a window over the bonding pad area.

2. An improved bonding pad on a bonding pad area on a substrate comprising:

spaced stripes on the substrate in a least the bonding pad area, the stripes arranged in a pattern of spaced concentric broken circles;

a conformal dielectric layer over at least the stripes presenting an irregular top surface configuration including grooves, said grooves having a depth;

a conformal barrier layer over the dielectric layer, said conformal barrier layer having an irregular top surface configuration including grooves;

a conformal metal layer over said barrier layer; and a passivation layer over said metal layer having a window over the bonding pad area.

3. The bonding pad of claim 1 wherein the barrier layer is formed of a material selected from the group consisting of titanium nitride, titanium tungsten, titanium, and tungsten.

4. The bonding pad of claim 1 wherein the barrier layer has a thickness in the range of about 500 to 2000 Å.

5. The bonding pad of claim 1 wherein the dielectric layer is formed of a material selected from the group consisting of phosphosilicate glass, silicon oxide and borophosphosilicate glass.

6. The bonding pad of claim 1 wherein the dielectric layer has a thickness in the range of about 2000 to 10,000 Å.

7. The bonding pad of claim 1 wherein the metal layer comprises a material selected form the group consisting of copper and aluminum.

8. The bonding pad of claim 1 wherein the metal layer has a thickness in the range of between about 2000 to 12,000 Å.

9. The bonding pad of claim 1 wherein the passivation layer has a thickness in the range of about 3000 to 20,000 Å.

10. The bonding pad of claim 1 wherein the passivation layer is formed from a material selected from the group consisting of silicon nitride, silicon oxynitride, borophosphosilicate glass, silicon oxide and borophosphosilicate glass.

11. The bonding pad of claim 1 wherein the substrate includes a insulating layer formed from a material selected from the group consisting of phosphosilicate glass, borophosphosilicate glass, and silicon oxide.

12. The bonding pad of claim 1 wherein the stripes are composed of a material selected from the group consisting of polycide, polysilicon, titanium tungsten, a metal, and titanium nitride.

13. The bonding pad of claim 1 wherein the stripes have a thickness in the range of about 1000 to 8000 Å and a width in the range of about 0.5 to 20 microns.

14. The bonding pad of claim 1 wherein the depth of said grooves in the conformal dielectric layer is in the range of about 1000 to 8000 Å.

15. The bonding pad of claim 2 wherein the substrate includes a insulating layer formed from a material selected from the group consisting of phosphosilicate glass, borophosphosilicate glass, and silicon oxide.

16. The bonding pad of claim 2 wherein the stripes are composed of a material selected from the group consisting of polycide, polysilicon, titanium tungsten, a metal, and titanium nitride.

17. The bonding pad of claim 2 wherein the stripes have a thickness in the range of about 1000 to 8000 Å and a width in the range of about 0.5 to 20 microns.

18. The bonding pad of claim 2 wherein the depth of said grooves in the conformal dielectric layer is in the range of about 1000 to 8000 Å.

19. The bonding pad of claim 2 wherein the barrier layer is formed of a material selected from the group consisting of titanium nitride, titanium tungsten, titanium, and tungsten.

20. The bonding pad of claim 2 wherein the barrier layer has a thickness in the range of about 500 to 2000 Å.

* * * * *